(12) United States Patent
Tseng et al.

(10) Patent No.: US 6,836,873 B1
(45) Date of Patent: Dec. 28, 2004

(54) STATIC NOISE ANALYSIS WITH NOISE WINDOW ESTIMATION AND PROPAGATION

(75) Inventors: Kenneth Tseng, Cupertino, CA (US); Vinod Kariat, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/313,857

(22) Filed: Dec. 6, 2002

(51) Int. Cl.[7] .............................................. G06F 17/50
(52) U.S. Cl. ................... 716/4; 716/5; 716/6
(58) Field of Search .......................... 716/1–6, 16–18, 716/10; 703/13–15

(56) References Cited

U.S. PATENT DOCUMENTS

| | | | | |
|---|---|---|---|---|
| 6,405,348 | B1 * | 6/2002 | Fallah-Tehrani et al. | 716/6 |
| 6,536,022 | B1 * | 3/2003 | Aingaran et al. | 716/5 |
| 6,587,815 | B1 * | 7/2003 | Aingaran et al. | 703/13 |
| 6,637,014 | B2 * | 10/2003 | Casavant | 716/6 |
| 6,651,229 | B2 * | 11/2003 | Allen et al. | 716/6 |
| 2002/0104064 | A1 * | 8/2002 | Sasaki et al. | 716/6 |

OTHER PUBLICATIONS

Shepard, Kenneth L. et al., "Noise in Deep Submicron Digital Design", Proc. of the IEEE/ACM International Conference on Computer–Aided Design, Nov. 1996, pp. 524–531.

Chen, Pinhong et al. "Towards True Crosstalk Noise Analysis", Int. Conf. on Computer–Aided Design, 1999, pp. 132–137.

Xiao, Tong et al., "Worst Delay Estimation in Crosstalk Aware Static Timing Analysis", Int. Conf. on Computer–Aided Design, 2000, pp. 115–120.

Scheffer, Lou, "What is the Appropriate Model for Crosstalk Control?", 13th Symp. on Integrated Circuits and Systems Design, 2000, pp. 315–320.

Alpert, Charles J. et al., "Buffer Insertion for Noise and Delay Optimization", IEEE Trans. on Computer–Aided Design of Integrated Circuits and Systems, vol. 18, No. 11, Nov. 1999, pp. 1633–1645.

(List continued on next page.)

*Primary Examiner*—Vuthe Siek
*Assistant Examiner*—Binh Tat
(74) *Attorney, Agent, or Firm*—Bingham McCutchen LLP

(57) ABSTRACT

Static noise analysis simulates crosstalk functional noise by estimating a crosstalk functional noise window and by calculating the propagation of the noise window through a network. For example, the analysis can include simulations of injecting a noise window onto a network, propagating the noise window through the network until it reaches a register, and comparing the noise window with a register's sensitive window. The noise window for the net is calculated based on a duration of time in which noise glitches caused by capacitive coupling to aggressor nets can occur. The noise window is propagated through the net in a forward direction until the noise is attenuated or reaches a register's input. At the register's input, a sensitive window can filter the noise window so that only the portion of the noise window that coincides with the register's clock trigger time is considered in the noise analysis.

30 Claims, 5 Drawing Sheets

OTHER PUBLICATIONS

Chen, Lauren Hui et al, "Aggressor Alignment for Worst-Case Crosstalk Noise", IEEE Trans. on Computer-Aided Design of Integrated Circuits and Systems, vol. 20, No. 5, May 2001, pp. 612–621.

Shepard, K.L. et al., "Cell characterization for noise stability", IEEE 2000 Custom Integrated Circuits Conference, 2000, pp. 91–94.

Levy, Rafi et al., "ClariNet: A noise analysis tool for deep submicron design", Design Automation Conference, 2000, pp. 233–238.

CeltIC User Guide, Cadence Design Systems, Inc., Aug. 2002.

PacifIC User Guide, Cadence Design Systems, Inc., Aug. 2002.

* cited by examiner

STATIC NOISE ANALYSIS WITH NOISE WINDOW ESTIMATION AND PROPAGATION

FIELD OF THE INVENTION

This invention is related generally to the field of analyzing simulated integrated circuits, and specifically to the field of detecting crosstalk induced functional failure in designs of electronic circuitry.

BACKGROUND OF THE INVENTION

As processing technology for integrated circuits scales down to 0.13 micron and below, capacitive crosstalk is having an increasingly adverse effect on the functionality of the circuits. For example, crosstalk noise can cause circuit functional failure and noise induced delay changes (speedup or slowdown), leading to increasing number of chip failures. Traditional noise analysis approaches are unable to accurately and efficiently detect functional failures resulting from crosstalk noise.

Early research on noise analysis focused on functional failures caused by charge sharing, crosstalk and leakage noise in dynamic circuits. Recently noise induced chip failures are manifested in static cell based design as well, where the majority of the research has been focused on the noise effect caused by signal delay. However, functional crosstalk noise failures are real even in static CMOS logic devices. For example, a crosstalk noise glitch is injected into a circuit through capacitive coupling, and propagates along the circuit's path until it either is attenuated by circuit loads, or is amplified and input to a storage element such as a register. If the crosstalk noise glitch is large enough, and reaches the input of the storage element at the right time, a functional failure, or violation, occurs and results in the wrong logic state being stored. Therefore, the design of the static logic devices needs to be analyzed to detect and remove functional failures before the devices are built.

A traditional approach to crosstalk noise analysis is net-centric. This approach simply calculates the glitch noise magnitude at every net in the logic device and reports the nets with glitch magnitudes exceeding a certain DC threshold as potential violators. However, this approach often reports hundreds or even thousands of false violations, which can hide real noise failures and may impose significant and unnecessary costs in the design of the device.

For example, once noise violations are detected, they must be fixed by design changes, such as buffer insertion, driver sizing or rewiring. However, because existing techniques in noise analysis tend to overestimate the number of noise violations, changes are made in the design process to prevent problems that do not really exist. These design changes, in addition to being unnecessary, can be time consuming, because the noise analysis and the resulting design changes take place late in the design process. Hence, reducing the amount of false noise violations is critical to increasing the speed of the design process for new chips.

Because traditional static noise analysis is net-centric, there is a need for a static noise analysis that can detect and report functional failures in a path-centric way.

SUMMARY OF THE INVENTION

A method of static noise simulation and analysis includes determining a noise window of a network, determining a sensitive window of the network, and filtering the noise window with the sensitive window.

The noise window of the network may be determined by calculating one or more aggressor noise windows for the network, and combining the aggressor noise windows into a combined noise window. The noise window of the network may be further determined by simulating the propagation of the combined noise window through a logic gate of the network.

The sensitive window of the network may be based on a clock time. For example, the sensitive window may include the clock trigger time, which is when data is clocked-in to data storage elements.

Filtering the noise window with the sensitive window may be performed by calculating an intersection of the noise window and the sensitive window to produce an effective noise window. The method may further include propagating the effective noise window to a register of the network, and determining the noise immunity of the register based on the effective noise window.

Other and further objects, features, aspects, and advantages of the present invention will become better understood with the following detailed description of the accompanying drawings.

BRIEF DESCRIPTION OF THE DRAWINGS

The present invention is illustrated by way of example and may be better understood by referring to the following description in conjunction with the accompanying drawings, in which like references indicate similar elements and in which.

DETAILED DESCRIPTION

Static noise analysis is extended to detect and report functional failures in a path-centric way. The analysis considers timing and propagation characteristics, such as delay and amplitude, of noise glitches in a network. If the noise glitch propagates to an input of a register, the analysis considers the timing relationship between the noise glitch and the active period of the register's clock signal.

In one embodiment, the analysis simulates crosstalk functional noise by estimating a crosstalk functional noise window and by calculating the propagation of the noise window through a network. For example, the analysis can include simulations of injecting a noise window onto a network, propagating the noise window through the network until it reaches a register, and comparing the noise window with a register's sensitive window. The noise window for the net is calculated based on a duration of time in which noise glitches caused by capacitive coupling to aggressor nets can occur. The noise window is propagated through the net in a forward direction until the noise is attenuated or reaches a register's input. At the register's input, a sensitive window can filter the noise window so that only the portion of the noise window that coincides with the register's clock trigger time is considered in the noise analysis.

This analysis significantly reduces false reports of functional failures, because it accounts for noise glitches that are attenuated by circuit loads before they reach a register's input, and are therefore incapable of causing a functional failure in a register. Also, this approach accounts for noise glitches that reach a register's input when the register's clock signal is inactive, and therefore cannot be clocked into the register to cause a functional failure. By removing the attenuated noise and the untimely noise from consideration during analysis, the number of false noise violations that are reported can be thirty times less than traditional approaches.

Figure 1:
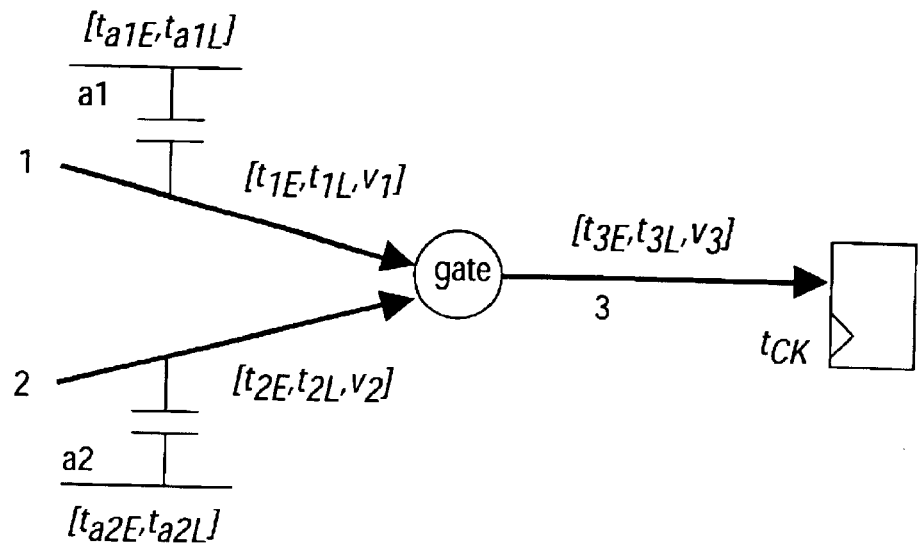
FIG. 1 shows an example of a model used to perform static noise analysis.

FIG. 1 shows an example of a model used to perform static noise analysis. In FIG. 1, nets a1 and a2 are aggressors to nets 1 and 2, respectively. A timing window of a switching signal in net a1 may be defined by the switching signal's early and late arrival times, and represented by $[t_{a2E}, t_{a2L}]$. When a1 switches, a noise glitch is created on net 1 at a time delay of $t_{Da1}$ from the switching point of a1 to the gate input of net 1. The peak magnitude of the noise on net 1 is represented by $v_1$. Hence, the coupling noise window on net 1 may be represented by the triplet $[t_{1E}, t_{1L}, v_1]$, where:

$$[t_{1E}, t_{1L}, v_1] = [t_{a1E} + t_{Da1}, t_{a1L} + t_{Da1}, v_{a1}] \quad \text{Eq. (1)}$$

The coupling noise window on net 1 thus encapsulates the maximum magnitude of the noise within its corresponding time bounds to produce a worst case noise value within a time envelope.

A similar calculation is performed on net 2 to calculate the coupling noise window induced on net 2 by aggressor net a2. The timing window of a2 is represented by the $[t_{a2E}, t_{a2L}]$ pair. The coupling noise window of net 2 is represented by the $[t_{2E}, t_{2L}, v_2]$ triplet, where $t_{2E}$ is the early arrival time of aggressor net a2, $t_{2L}$ is the late arrival time, and $v_2$ is the peak magnitude of the noise on net 2, and is calculated by:

$$[t_{2E}, t_{2L}, v_2] = [t_{a2E} + t_{Da2}, t_{a2L} + t_{Da2}, v_{a2}]. \quad \text{Eq. (2)}$$

The noise window on net 3 represented by $[t_{3E}, t_{3L}, v_3]$, and is calculated by propagating the noise windows of nets 1 and 2 through the logic gate's input to produce a propagated noise window that is output by the logic gate onto net 3. The propagated noise window includes an output noise waveform with a propagation delay from the input noise peak to output noise peak. The propagation delay is represented by $t_{D13}$ and $t_{D23}$. The output noise magnitude from input noises at net 1 and net 2 are represented by $v_{13}$ and $v_{23}$ respectively. The propagated noise window at net 3 is the union of the noise window on net 3 contributed by net 1, and the noise window on net 3 contributed by net 2:

$$[t_{3E}, t_{3L}, v_3] = [t_{1E} + t_{D13}, t_{1L} + t_{D13}, v_{13}] \cup [t_{2E} + t_{D23}, t_{2L} + t_{D23}, v_{23}]. \quad \text{Eq. (3)}$$

The sensitive window defines the period of time where the register is actively clocking in new data. The register's sensitive window is based on the register's clock trigger time, and may include padding for setup and hold time. The sensitive window (sw) may be defined as the earliest clock arrival time minus the setup time, and the latest clock arrival time plus the hold time:

$$sw = [t_{CK} - t_{SETUP}, t_{CK} + t_{HOLD}]. \quad \text{Eq. (4)}$$

If the noise window includes a glitch that arrives at the register's input during the sensitive window time period, it may induce a functional error. All other areas of the noise window may be removed from further consideration and analysis because they are outside of the sensitive window period. Therefore, an effective noise window is calculated to determine the overlap in time between the noise window and the sensitive window, and is:

$$[t_{3E'}, t_{3L'}, v_{3'}] = [t_{3E}, t_{3L}, v_3] \cap [t_{CK} - t_{SETUP}, t_{CK} + t_{HOLD}]. \quad \text{Eq. (5)}$$

This intersection of the noise window with the sensitive window filters the noise window so that the resulting effective noise window $[t_{3E'}, t_{3L'}, v_{3'}]$ is propagated to the register for functional failure analysis. The effective noise window provides the time bounds and the maximum magnitude of the noise wave that is propagated to the register to determine whether the register is immune to the crosstalk noise. A full register simulation sweep with the worst case input noise glitch can be used based on the effective noise window to determine if the register incorrectly clocks-in the opposite logic state induced by the noise glitch. Combining the path-based noise window propagation analysis with the full register simulation to determine if a functional error occurs eliminates the need for an immunity noise metric, such as a metric based on the magnitude of the noise, the width of the noise, or the noise sensitivity.

Figure 2:
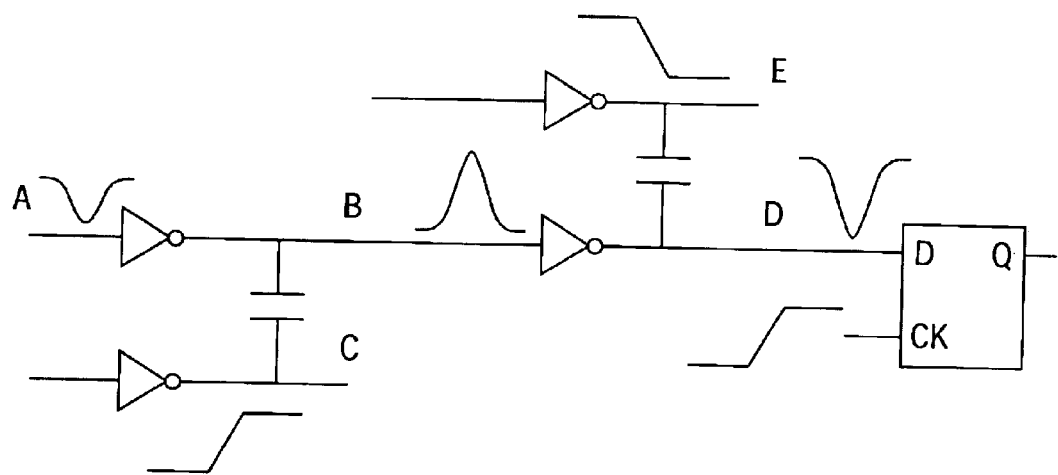
FIG. 2 shows an example of a network that combines propagated and coupling noise windows in static noise analysis.

FIG. 2 shows an example of a network that combines propagated and coupling noise windows. Propagated noise windows may be combined with other noise windows, such as a coupling noise window, or another propagated noise window, before they reach a register. The resulting combined noise window is an envelope that encapsulates the magnitude of the noise glitches as a function of time over a clock period.

For example, net A has a noise window caused by capacitive coupling, which is propagated onto net B as a propagated noise window, and is combined with a coupling noise window on net B caused from a rising edge of a signal on aggressor net C. The combined noise window on net B is propagated onto net D, where it is further combined with a coupling noise window from aggressor net E. The noise window on net D is filtered by the register's sensitive window to produce an effective noise window. The sensitive window is determined based on the timing window of the clock signal, and may be padded with a setup time on the early edge and a hold time on the late edge of the clock signal. The noise stability on the flip flop storage node is evaluated with respect to the effective noise window that is input from D to determine whether the flip flop clocks-in false data induced by the noise. If so, then a noise violation occurs and is reported.

Figure 3:
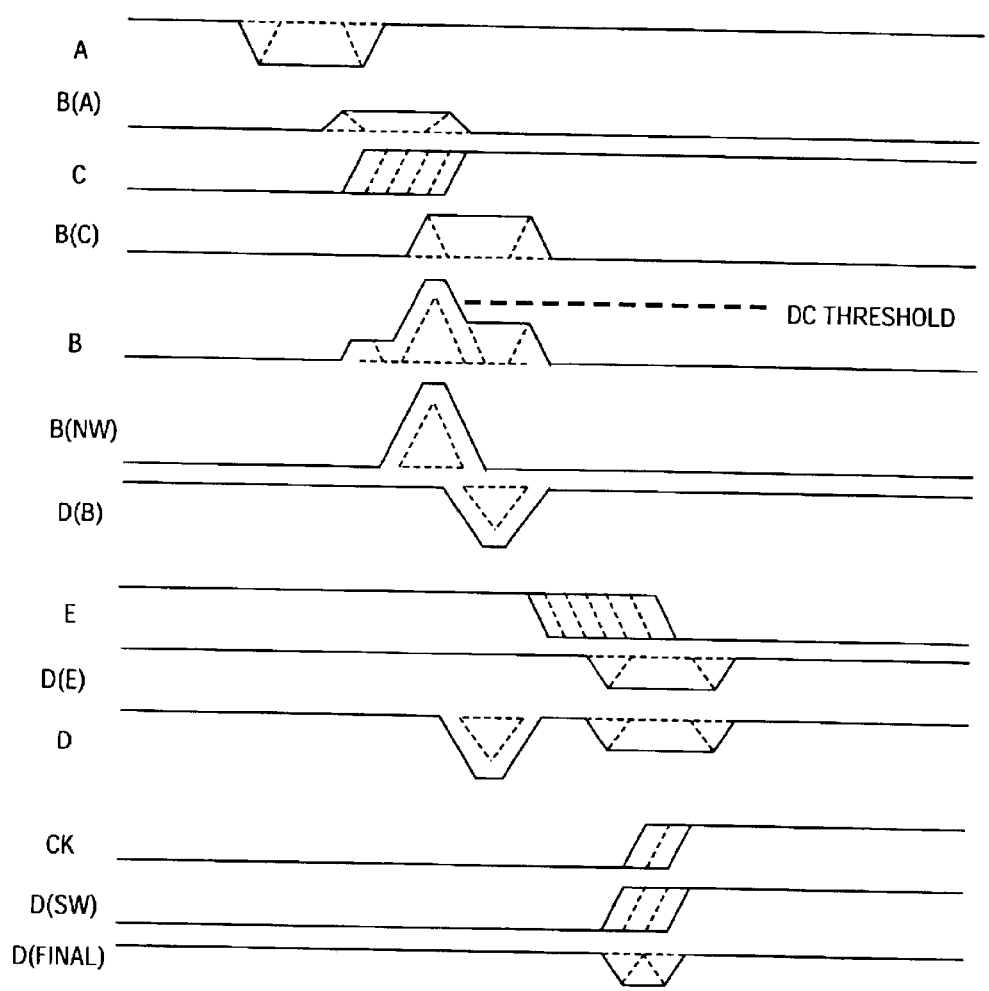
FIG. 3 shows a static noise analysis timing diagram of the noise windows in the network shown in FIG. 2.

FIG. 3 shows the corresponding timing diagram of the noise windows of FIG. 2. The propagation of a noise window from net A to net B produces propagated noise window B(A) on net B. The noise window B(A) is time-shifted by the propagation delay from net A to net B. The noise window on B that is caused by the coupling noise window from C is shown as noise window B(C). The superposition of noise windows B(A) and B(C) is used to derive the combined noise envelope on B. During simulation, this combined noise envelope may be adjusted to account for non-linear characteristics of the driving gate. For example, the combined noise envelope may be larger or smaller, or may be wider or narrower, based on the non-linear characteristics.

The combined noise envelope on net B may be filtered to remove noise that will be attenuated before reaching a register. For example, if the noise magnitude is less than a given DC threshold, such as the minimum threshold voltage of the receiving gates, the noise will probably not be propagated through any of the receiving gates. Therefore, the regions of the noise envelope on net B that are less than the DC threshold are removed from further consideration and analysis, and the resulting filtered noise window on B is the region of the noise envelope that exceeds the DC threshold, as shown in B(NW).

The noise on net D is caused by a combination of crosstalk from aggressor E resulting in coupling noise window D(E), and the propagation of the noise window from B resulting in propagated noise window D(B). The combined noise window on net D is shown by the superposition of noise windows D(E) and D(B). Because the noise window on net D is received by the input of a register, the noise window is constrained by the sensitive window of the register, D(SW), to produce the final noise window D(final). A circuit simulation of the effect of the final noise window D(final) on the flip flop can be performed and analyzed to determine the noise stability of the flip flop to the final noise window.

In this example, if the noise window on D arrives a bit earlier, it completely misses the sensitive window. The simulation results would therefore determine that the flip flop is immune to this noise window and would not report a false functional violation of the flip flop because of this noise window. If the noise window on D arrives a bit later, a much larger noise signal would be clocked into the flip flop, and a true functional failure may be identified during simulation.

Figure 4:
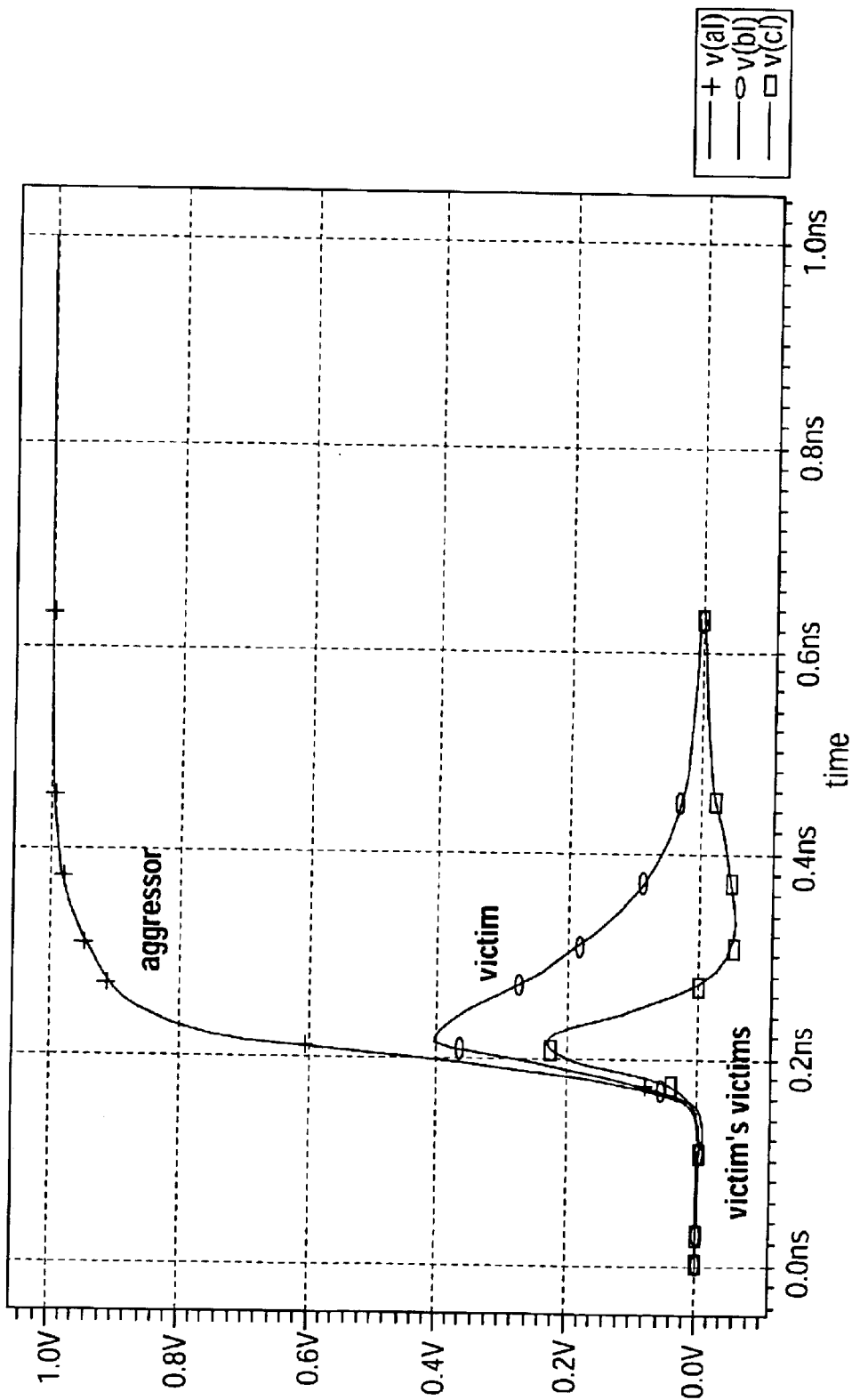
FIG. 4 shows an example of an induced noise glitch on a victim network that induces another noise glitch on another victim network and is considered during static timing analysis.

In addition to noise windows generated from coupling noise and propagated noise, the noise windows can include noise caused by a glitching aggressor net. As shown in FIG. 4, a glitching noise window occurs when an aggressor net causes a noise glitch on a victim net, which in turn causes a noise glitch on the victim's neighbor. An iterative approach to static noise analysis may be used to consider the glitching aggressors and the glitching noise windows. Because the noise impact from glitching aggressors are usually small, the iterations generally converge quickly.

Figure 5:
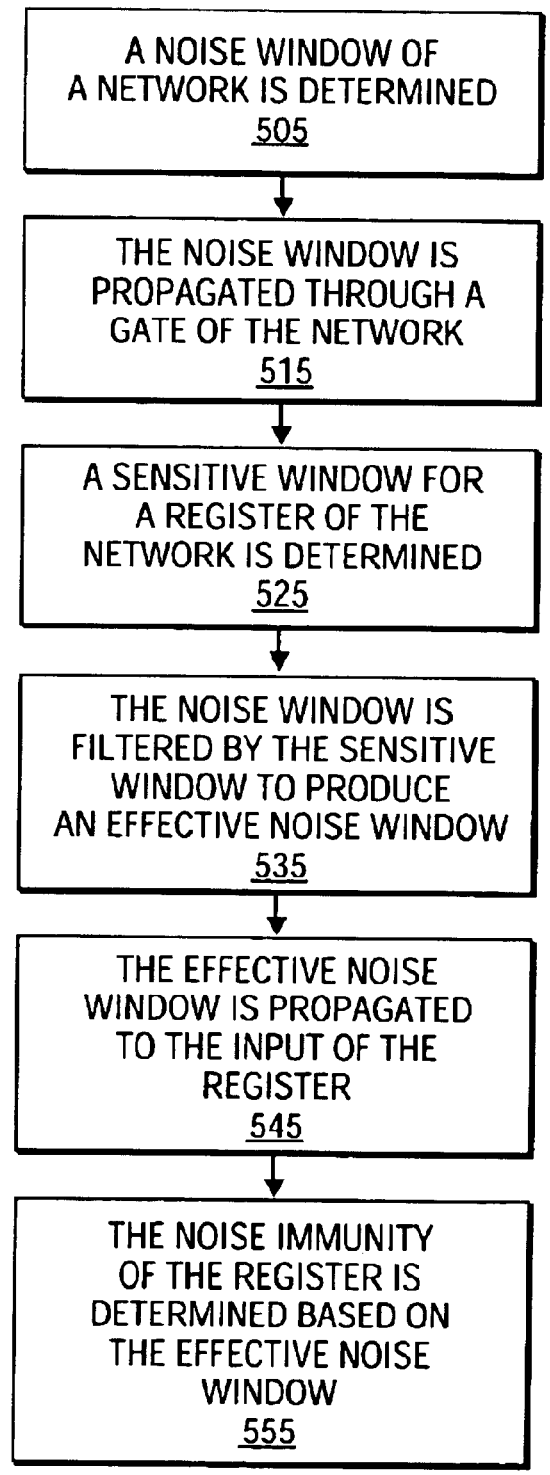
FIG. 5 shows an embodiment of a method of static noise analysis.

FIG. 5 shows an embodiment of a method of static noise analysis. A noise window of a network is determined, 505. The noise window is propagated through a gate of the network, 515. A sensitive window for a register of the network is determined, 525. The noise window is filtered by the sensitive window to produce an effective noise window, 535. The effective noise window is propagated to the input of the register, 545. The noise immunity of the register is determined based on the effective noise window, 555.

Figure 6:
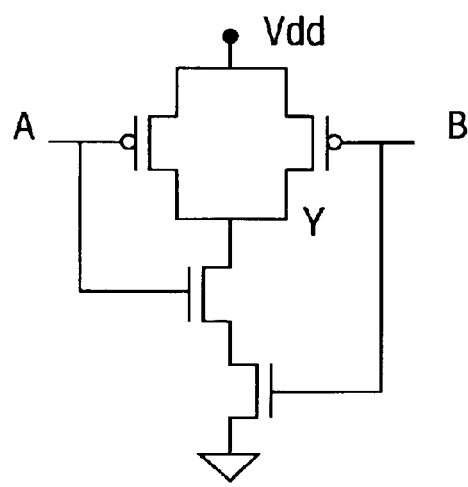
FIG. 6 shows a transistor level representation of a NAND gate with two inputs that may be used to simulate propagation of noise windows through a logic gate during static noise analysis.

The noise propagation through a gate may be simulated at the transistor level. For example, FIG. 6 shows a transistor level representation of a NAND gate with two inputs. Sensitization tables, such as Tables 1 and 2 for example, can be used to simulate noise propagation through this gate, including worst case combinations of noise glitches.

TABLE 1

| A | B | Y(VH) |
|---|---|---|
| 1 | VL | VH |
| VL | 1 | VH |

Table 1 shows the two different sensitizations for input VL noise. When at least one of the input lines, either A or B, is high, the corresponding NMOS transistor in the pulldown stack of FIG. 4 is ON. As a result, VL noise that is input to the NAND gate on the other input line causes VH noise on the output line Y.

TABLE 2

| A | B | Y(VL) |
|---|---|---|
| 1 | VH | VL |
| VH | 1 | VL |
| VH | VH | VL |

As shown in Table 2, three vectors may be used to sensitize the output VL noise due to input VH noise. The worst case noise is caused when both inputs A and B receive input VH noise around the same time. The noise window's width and magnitude may be adjusted during simulation.

A method of static noise analysis has been disclosed. The static noise analysis method may be embodied in a computer-readable format, such as a software application program, and stored in a computer-readable medium, such as an electronic memory. The software application program may be read from memory and executed by a general purpose computing device, such as a central processing unit, to perform static noise analysis. Input and output devices, such as a keyboard, a mouse, and a display, may be connected to the computing device by a bus, and can be used by a person to input and receive information relating to static noise analysis to and from the computing device. The method may also be performed by electronic hardware circuitry, or by a combination of hardware and software.

The static noise analysis is able to account for propagated noise with correct timing to reduce the number of false violations. The static noise analysis can combine propagated noise with other noise sources with correct timing. The static noise analysis can account for the effect of glitch noise on the operation of a register, or latch, through simulation of the true operation of the latch. The static noise analysis also can analyze noise from glitching aggressor nets.

The noise analysis may be used to account for the combined noise effect of a large number of small aggressors on a circuit. For example, the number of small aggressors for a given net may exceed a thousand for an appropriate value of the net's coupling capacitance extraction threshold. If each small aggressor is analyzed separately, the run-time of the simulation maybe excessively high. However, the behavior of a large number of small aggressors can be captured in a single noise window using superposition to provide a model of the combined effects of the small aggressors on the net at any given time.

The noise analysis can provide a deterministic noise immunity metric by simulating an entire register in the presence of worst case glitch noise when the clock is switching. Noise window bucketing may be performed to further reduce noise window pessimism. Logic and timing traceback may be implemented to prune impossible aggressor transitions and to provide a delay analysis of the crosstalk noise.

While preferred embodiments have been shown and described, it will be apparent to one of ordinary skill in the art that numerous alterations may be made without departing from the spirit or scope of the invention. Therefore, the invention is not to be limited except in accordance with the following claims.

We claim:

1. A method of noise analysis of an integrated circuit design comprising:
   determining a noise window of a network;
   propagating a noise window of the network;

determining a sensitive window of the network; and filtering the noise window with the sensitive window by calculating an intersection of the noise window and the sensitive window to produce an effective noise window, wherein the sensitive window is determined based upon a clock time and the sensitive window corresponds to a period of time in which new data is clocked in.

2. The method of claim 1 wherein determining the noise window of the network further comprises:

identifying one or more aggressor networks coupled to the network; and for each aggressor network, determining a corresponding aggressor noise window induced on the network; and combining the aggressor noise windows.

3. The method of claim 2 wherein determining the corresponding aggressor noise window comprises:

calculating a peak magnitude of a noise wave from the aggressor network; and calculating a timing window of the noise wave based on an early arrival time and a late arrival time of the noise wave.

4. The method of claim 2 further comprising:

determining propagation of the noise window through a logic gate of the network.

5. The method of claim 4 wherein determining propagation of the noise window further comprises:

calculating a propagated noise magnitude and waveform;

calculating a propagation delay.

6. The method of claim 2 wherein at least one aggressor noise window is selected from the group consisting of: switching noise and glitching noise.

7. The method of claim 1 wherein determining a sensitive window further comprises:

subtracting a setup time from an earliest clock arrival time; and adding a hold time to a latest clock arrival time.

8. The method of claim 1 further comprising:

propagating the effective noise window to a register of the network; and determining the immunity of the register to the effective noise window.

9. A method of noise analysis of an integrated circuit design comprising:

determining a noise window of a network;

propagating a noise window of the network;

determining a sensitive window of the network; and filtering the noise window with the sensitive window by calculating an intersection of the noise window and the sensitive window to produce an effective noise window, wherein the sensitive window is determined based upon a clock time and the sensitive window corresponds to a period of time in which new data is clocked in;

wherein the noise window accounts for a combined noise effect of a plurality of aggressors on the network.

10. The method of claim 9, wherein the noise window accounts for a plurality of aggressors using superposition to provide a model of the combined noise effects of the aggressors on the network at a given time.

11. An article of manufacture comprising a computer readable medium storing instructions which, when executed by a processing system, cause the system to perform a method of noise analysis of an integrated circuit design, the method comprising:

determining a noise window of a network;

propagating a noise window of the network;

determining a sensitive window of the network; and filtering the noise window with the sensitive window by calculating an intersection of the noise window and the sensitive window to produce an effective noise window, wherein the sensitive window is determined based upon a clock time and the sensitive window corresponds to a period of time in which new data is clocked in.

12. The medium of claim 11 wherein determining the noise window of the network further comprises:

identifying one or more aggressor networks coupled to the network; and for each aggressor network, determining a corresponding aggressor noise window induced on the network; and combining the aggressor noise windows.

13. The medium of claim 12 wherein determining the corresponding aggressor noise window comprises:

calculating a peak magnitude of a noise wave from the aggressor network; and calculating a timing window of the noise wave based on an early arrival time and a late arrival time of the noise wave.

14. The medium of claim 12, the method further comprising:

determining propagation of the noise window through a logic gate of the network.

15. The medium of claim 14 wherein determining propagation of the noise window further comprises:

calculating a propagated noise magnitude and waveform;

calculating a propagation delay.

16. The medium of claim 12 wherein at least one aggressor noise window is selected from the group consisting of: switching noise and glitching noise.

17. The medium of claim 11 wherein determining a sensitive window further comprises:

subtracting a setup time from an earliest clock arrival time; and adding a hold time to a latest clock arrival time.

18. The medium of claim 11, the method further comprising:

propagating the effective noise window to a register of the network; and determining the immunity of the register to the effective noise window.

19. An article of manufacture comprising a computer readable medium storing instructions which, when executed by a processing system, cause the system to perform a method of noise analysis of an integrated circuit design, the method comprising:

determining a noise window of a network;

propagating a noise window of the network;

determining a sensitive window of the network; and filtering the noise window with the sensitive window by calculating an intersection of the noise window and the sensitive window to produce an effective noise window, wherein the sensitive window is determined based upon a clock time and the sensitive window corresponds to a period of time in which new data is clocked in;

wherein the noise window accounts for a combined noise effect of a plurality of aggressors on the network.

20. The medium of claim 19, wherein the noise window accounts for a plurality of aggressors using superposition to provide a model of the combined noise effects of the aggressors on the network at a given time.

21. An apparatus for noise analysis of an integrated circuit design comprising:

means for determining a noise window of a network;

means for propagating a noise window of the network;

means for determining a sensitive window of the network; and means for filtering the noise window with the sensitive window by calculating an intersection of the noise window and the sensitive window to produce an effective noise window, wherein the sensitive window is determined based upon a clock time and the sensitive window corresponds to a period of time in which new data is clocked in.

22. The apparatus of claim 21 wherein said means for determining the noise window of the network further comprises:

means for identifying one or more aggressor networks coupled to the network;

means for determining a corresponding aggressor noise window induced on the network for each aggressor network; and means for combining the aggressor noise windows.

23. The apparatus of claim 22 wherein said means for determining the corresponding aggressor noise window comprises:

means for calculating a peak magnitude of a noise wave from the aggressor network; and means for calculating a timing window of the noise wave based on an early arrival time and a late arrival time of the noise wave.

24. The apparatus of claim 22 further comprising:

means for determining propagation of the noise window through a logic gate of the network.

25. The apparatus of claim 24 wherein said means for determining propagation of the noise window further comprises:

means for calculating a propagated noise magnitude and waveform; and means for calculating a propagation delay.

26. The apparatus of claim 22 wherein at least one aggressor noise window is selected from the group consisting of: switching noise and glitching noise.

27. The apparatus of claim 21 wherein said means for determining a sensitive window further comprises:

means for subtracting a setup time from an earliest clock arrival time; and means for adding a hold time to a latest clock arrival time.

28. The apparatus of claim 21 further comprising:

means for propagating the effective noise window to a register of the network; and means for determining the immunity of the register to the effective noise window.

29. An apparatus for noise analysis of an integrated circuit design comprising:

means for determining a noise window of a network;

means for propagating a noise window of the network;

means for determining a sensitive window of the network; and means for filtering the noise window with the sensitive window by calculating an intersection of the noise window and the sensitive window to produce an effective noise window, wherein the sensitive window is determined based upon a clock time and the sensitive window corresponds to a period of time in which new data is clocked in;

wherein the noise window accounts for a combined noise effect of a plurality of aggressors on the network.

30. The apparatus of claim 29, wherein said means for determining the noise window further comprises:

means for accounting for a plurality of aggressors using superposition to provide a model of the combined noise effects of the aggressors on the network at a given time.

* * * * *